(12) United States Patent
Maisenbacher et al.

(10) Patent No.: US 10,448,533 B2
(45) Date of Patent: Oct. 15, 2019

(54) HOLDER FOR FLAT, APPROXIMATELY RECTANGULAR DEVICES SUCH AS TABLET COMPUTERS OR SMARTPHONES

(71) Applicant: Kinetix AG, Chur (CH)

(72) Inventors: Michael Maisenbacher, Calw (DE); Peter Spang, Waldachtal (DE); Walter Funk, Simmersfeld (DE); Michael Andreas Keller, Freudenstadt (DE)

(73) Assignee: Kinetix AG, Chur (CH)

( * ) Notice: Subject to any disclaimer, the term of this patent is extended or adjusted under 35 U.S.C. 154(b) by 0 days.

(21) Appl. No.: 16/071,478

(22) PCT Filed: Jan. 27, 2017

(86) PCT No.: PCT/EP2017/051788
§ 371 (c)(1),
(2) Date: Jul. 19, 2018

(87) PCT Pub. No.: WO2017/140474
PCT Pub. Date: Aug. 24, 2017

(65) Prior Publication Data
US 2019/0037722 A1    Jan. 31, 2019

(30) Foreign Application Priority Data

Feb. 15, 2016  (DE) .................. 10 2016 102 611
Oct. 31, 2016  (DE) .................. 10 2016 120 748

(51) Int. Cl.
*F16M 11/00*    (2006.01)
*H05K 7/14*     (2006.01)
(Continued)

(52) U.S. Cl.
CPC .......... *H05K 7/1401* (2013.01); *B60K 35/00* (2013.01); *B60R 11/0235* (2013.01);
(Continued)

(58) Field of Classification Search
CPC ........ F16M 11/06; F16M 11/10; F16M 11/12; H01F 7/0252; B60R 11/00
See application file for complete search history.

(56) References Cited

U.S. PATENT DOCUMENTS 7,753,330 B2 * 7/2010 Brief .................. B60R 11/0241
                                                248/278.1
2008/0315479 A1 * 12/2008 Fayollas .............. F16M 11/041
                                                269/58
(Continued)

FOREIGN PATENT DOCUMENTS

DE    20 2015 101259 U1    3/2015
EP         2 843 287 A1    3/2015
WO    WO 2009/020254 A1    2/2009

Primary Examiner — Amy J. Sterling
(74) Attorney, Agent, or Firm — Aslan Law, P.C.

(57) ABSTRACT

A holder for detachably fastening a flat, approximately rectangular device such as a tablet computer or a smartphone to a part, in particular to a motor vehicle part, said holder comprising a holding mechanism for detachably mounting the device, and a fastening element that is connected to the holding mechanism to connect the holder to the part; a rotary bearing that can rotate about an axis of rotation is connected to the holding mechanism, and a pivot bearing is connected to the rotary bearing and to the fastening element; the rotary bearing includes a first portion that is connected to the holding mechanism as well as a second portion that is connected to the fastening element.

22 Claims, 10 Drawing Sheets

Figure 1:
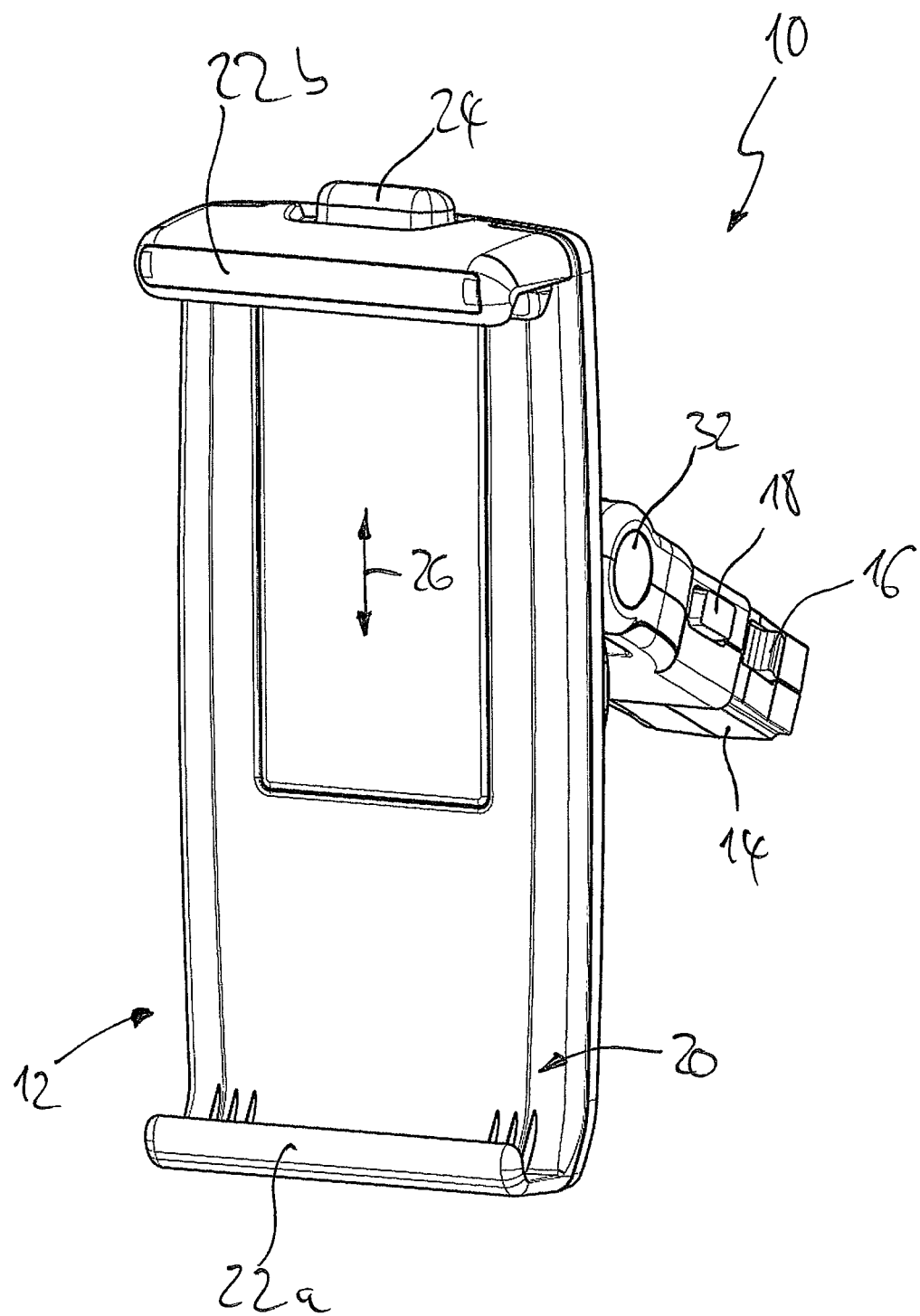

(51) Int. Cl.
  *B60R 11/02* (2006.01)
  *B60K 35/00* (2006.01)
  *G06F 1/16* (2006.01)
  *H05K 7/16* (2006.01)
  *B60R 11/00* (2006.01)

(52) U.S. Cl.
  CPC ...... *B60R 11/0241* (2013.01); *B60R 11/0252* (2013.01); *G06F 1/1613* (2013.01); *H05K 7/16* (2013.01); *B60K 2370/81* (2019.05); *B60R 2011/0015* (2013.01); *B60R 2011/0059* (2013.01); *B60R 2011/0087* (2013.01)

(56) References Cited

U.S. PATENT DOCUMENTS

2011/0049321 A1 3/2011 Wu
2017/0276291 A1* 9/2017 Subratie ................ F16M 13/02

* cited by examiner

HOLDER FOR FLAT, APPROXIMATELY RECTANGULAR DEVICES SUCH AS TABLET COMPUTERS OR SMARTPHONES

The invention concerns a holder for detachably fastening of a flat, approximately rectangular device like a tablet computer or a smartphone to a component, in particular a component of a motor vehicle, wherein the holder comprises a holding mechanism for detachably holding the device and a fastening element that is connected to the holding mechanism to connect the holder with the component, wherein a rotary bearing is provided that is rotatable around an axis of rotation, wherein the rotary bearing is connected to the holding mechanism, and wherein a pivot bearing is provided which is connected to the rotary bearing and which is connected to the fastening element. The invention also concerns a fastening fixture that comprises such a holder.

Such holders are known from the state of the art, e.g. from EP 2 528 781 B1. In such a holder known from the state of the art, the rotary bearing is indirectly connected to the pivot bearing via a second rotary bearing, thus providing a sort of "con rod solution" with which the holder or the device attached to the holder can be pivoted between two usage positions. In this context, it is possible to fasten this holder into a socket of a motor vehicle by means of a suitable fastening element, or for example to fasten the holder indirectly onto the headrest rods of a motor vehicle with a suitable fastening element.

However, these holders have not always performed well when fastened to the headrest rods, in particular with regard to large tablet computers of the new generation that in a view from above often exceed the size of an A4 sheet of paper. On the one hand, a vertical positioning of the tablet computer may be prohibited by the "con rod" due to the proximity to the roof or the ceiling of the motor vehicle.

On the other hand, the latest, particularly large tablet computers also have display sizes of 13 inches or more. This tablet computer size affects the weight of the tablet computer, which increases accordingly. In the event of a crash the long lever arm of the con rod known from EP 2 528 781 B1 is disadvantageous because of the greater weight.

Therefore, the invention aims to provide a holder for detachably fastening of a flat, approximately rectangular device like a tablet computer or a smartphone to a component, in particular a component of a motor vehicle, with which larger tablet computers can also be fastened sturdily and securely.

This task is solved by a holder having the features of claim 1. Advantageous embodiments are specified in the dependent claims.

The holder according to the invention is characterized in that the rotary bearing comprises a first rotary bearing portion connected to the holding mechanism and a second rotary bearing portion connected to the fastening element, wherein locking elements are provided on the rotary bearing perpendicular to the axis of rotation of the rotary bearing, the locking elements being displaceable between a radial inner locking position and a radial outer release position, wherein in the release position the first rotary bearing portion is rotatable in relation to the second rotary bearing portion and wherein in the locking position the first rotary bearing portion is fixed in relation to the second rotary bearing portion, wherein an annular spring is provided which is designed and arranged such that the locking elements are pre-stressed in a radially inward direction into the locking position by the annular spring. Preferably, the first and second rotary bearing portions glide over one another when rotating around the rotary bearing. It is possible for the annular spring to be made from spring steel. However, it is also possible for the annular spring to be made from a plastic material, in particular from an elastically resilient plastic material. Advantageously, the annular spring is arranged radially, i.e. perpendicular to the axis of rotation of the rotary bearing, outside of the locking elements.

According to a first advantageous embodiment, the holder comprises the holding mechanism comprising a receiving portion for the device and holder elements located in the region of the receiving portion for holding the device, and the first rotary bearing portion is located on the side of the holding mechanism facing away from the receiving portion. Advantageously, the first rotary bearing portion is directly connected to the holding mechanism, though it is always connected or screwed to the holding mechanism in a torque proof manner.

Advantageously, a connecting element is provided, wherein the second rotary bearing portion is located on the connecting element and wherein the connecting element comprises pivot bearing portions of the pivot bearing. It is possible that pivot bearing counter-portions are provided which are located on the fastening element, wherein the pivot bearing portions and counter-portions correspond to one another in such a way that the pivot bearing is designed as a friction bearing.

Further, it is also advantageous when the first rotary bearing portion is designed as a cone, wherein the second rotary bearing portion is designed as a counter-cone. It has proven especially advantageous when the cone and the counter-cone comprise an identical inclination to the axis of rotation of the rotary bearing and are arranged coaxially to one another so that the cone and the counter-cone can glide over one another to realize the rotary bearing during rotating.

In order to be able to enable an adjustment of a tablet computer or a smartphone from portrait to landscape mode or vice versa and to lock the holder in the respective position, it has proven particularly advantageous when at the first rotary bearing portion multiple, preferably 4, locking grooves are provided which are arranged at regular distances from one another with respect to the circumference of the first rotary bearing portion. If 4 locking grooves are provided, it is particularly advantageous when the locking grooves are arranged at a 90° angle from one another. If 4 locking grooves are arranged in a 90° angle to one another, only adjustment from portrait to landscape mode is possible. If more than 4 locking grooves are provided in smaller angled increments, locking in interim positions is also possible.

According to a particularly advantageous embodiment of the holder, the locking elements comprise locking portions that correspond with the locking grooves such that the locking portions at least partially engage into the locking grooves when in locking position. For example, it is possible for the locking grooves to comprise a locking groove profile, wherein the locking portions comprise a locking portion profile that corresponds to a negative counterpart of the locking groove profile.

It has proven particularly advantageous when the locking grooves and the locking portions comprise a profile that is designed in such a way that rotation of the first rotary bearing portion in relation to the second rotary bearing portion results in a displacement of the locking elements from the locking position to the release position against the spring force of the annular spring. According to an advantageous embodiment of the holder, the locking grooves are designed as V-grooves, wherein the locking elements comprise V-shaped locking portions that correspond with the V-grooves. Rotating the first rotary bearing portion in relation to the second rotary bearing portion thus causes the V-grooves and V-shaped locking portions to slip around each other's circumference. This sliding along the circumference pushes the V-shaped locking portions radially outward against the spring force of the annular spring (i.e. perpendicular to the axis of rotation of the rotary bearing) and thus releases the locking grooves, so that the locking elements can be displaced from the locking position to the release position.

A particularly affordable and stable design of the holder includes multiple, preferably 2 locking elements which are arranged in a mirror symmetrical manner with respect to the axis of rotation.

It has proven especially advantageous when multiple, preferably 2 guide portions are provided on the second rotary bearing portion for the locking elements which are arranged in a mirror symmetrical manner with respect to the axis of rotation. Advantageously, the guide portions are attached in a torque proof manner to the second rotary bearing portion or are flush-cast into the second rotary bearing portion, e.g. via plastic injection molding, wherein the locking elements are guided in the guide portions. Because of the guide portions being attached to the second rotary bearing portion in a torque proof manner, the locking elements which are guided in the guide portions can engage into the locking grooves to interlock with the first rotary bearing portion such that the first rotary bearing portion is fixed in relation to the second rotary bearing portion.

In order to be able to guide the locking elements in a particularly secure manner, it is proven advantageous when the guide portions are designed to guide the locking elements. It is possible for an inner profile of the guide portions to correspond perpendicularly to the axis of rotation with an outer profile of the locking elements.

According to a particularly advantageous embodiment of the holder, the pivot bearing comprises a pivot bearing axis of rotation, wherein the pivot bearing axis of rotation is located in a plane of the first and/or second rotary bearing portion. In this way, a holder can be provided wherein its rotary bearing and its pivot bearing are realized in a particularly compact and space saving manner such that a holder can be provided which has a reduced overall size which can thus be mounted particularly closely to a component, for example to the headrest rods of a motor vehicle.

The aforementioned task is also solved by a fastening fixture having the features of claim 12. Such a fastening fixture includes a holder according to at least one of the claims 1 to 11 and at least one mounting fixture that comprises a receiving socket which is designed for detachably fastening of the fastening element of the holder.

According to a first advantageous embodiment of the fastening fixture, the mounting fixture comprises a base part with a receiving portion designed for being arranged at a tube-shaped component, and the mounting fixture comprises a band-shaped tensioning device designed for tensioning the mounting fixture at the tube-shaped component by tensioning the tube-shaped component between the receiving portion and the tensioning device. Advantageously, an elastic, deformable insertion piece is located in the receiving portion which may be made, for example, from rubber or from a soft plastic. A tube-shaped component can thus be used to easily and reliably fasten the mounting fixture onto the tube-shaped component between the receiving portion and the band-shaped tensioning device.

Advantageously, the band-shaped tensioning device includes a hook-and-loop fastener and/or a cable tie and/or an eccentric tensioning device.

According to another advantageous design of the fastening fixture, the mounting fixture comprises a suction cup designed for being fastened onto an even surface. Advantageously, the mounting fixture includes a release lever usable for detaching the suction cup.

According to another advantageous embodiment of the fastening fixture, the mounting fixture is designed for being fastened onto a wall. It is possible for the mounting fixture to comprise a groove stone-shaped fastening portion that comprises drill holes with which the fastening portion or the mounting fixture can be fastened onto a wall.

According to another particularly advantageous design of the fastening fixture, it is possible that an extension piece is provided that comprises a fastening element and a receiving socket, the receiving socket being arranged away from the fastening element with respect to an axial direction, wherein the receiving socket is preferably arranged axially with respect to the fastening element. The fastening element of the holder can thus be inserted into the receiving socket of the extension piece, wherein the fastening element of the extension piece can be inserted into the receiving portion of the mounting fixture. This allows for an extension of the distance between pivot bearing 32 and the receiving portion of the mounting fixture, so that the fastening fixture can be better adjusted to the respective mounting requirement.

Other features and advantageous embodiments of the invention can be found in the following description, with which various designs of the invention are described and explained in greater detail.

Figure 2:
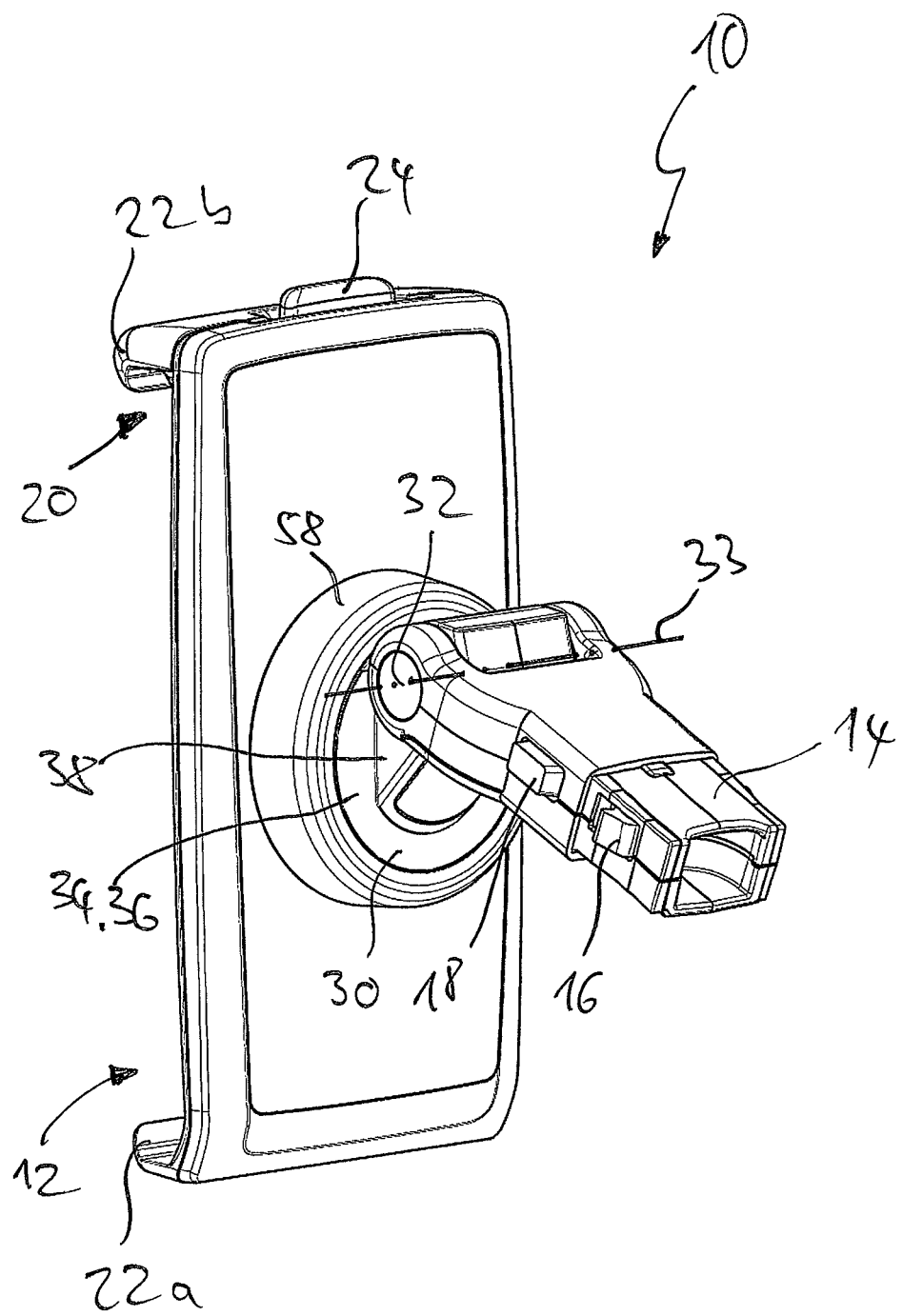
Figure 3:
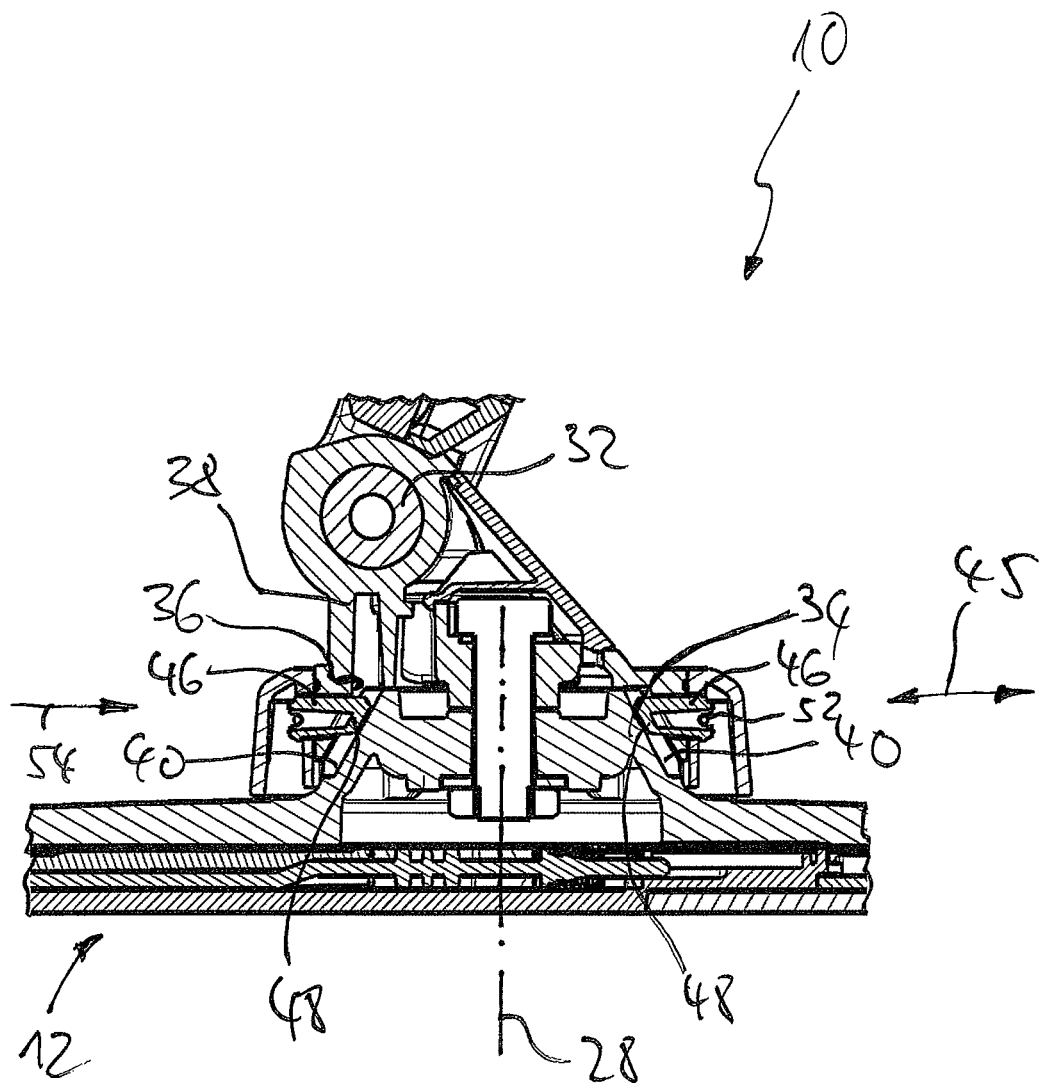
Figure 4:
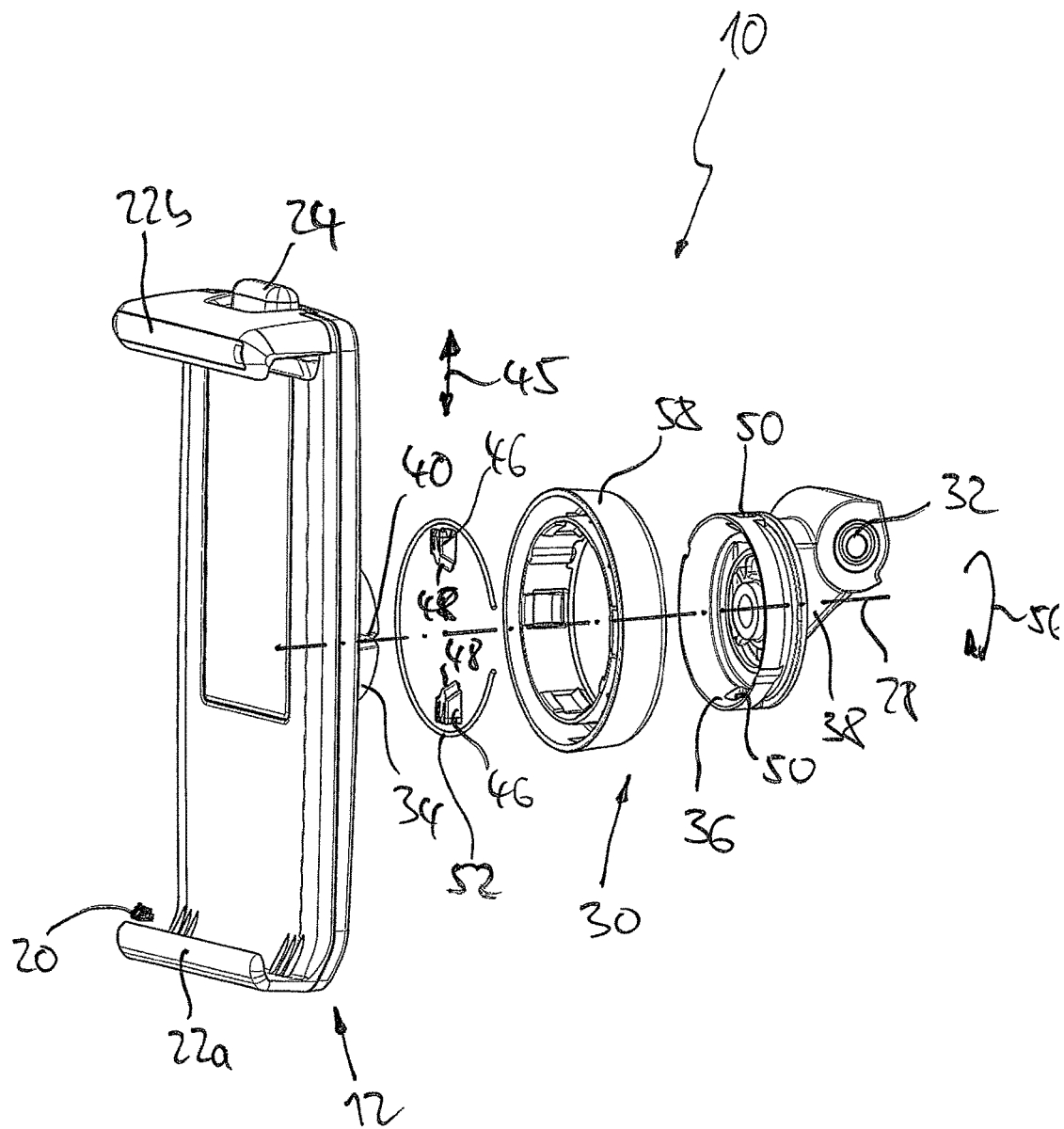

It is shown in:

FIG. 1 a perspective frontal view of a first design of a holder according to the invention;

FIG. 2 a perspective rear view of the holder according to FIG. 2;

FIG. 3 a detail of a sectional view through the holder according to FIGS. 1 and 2;

FIG. 4 a partially exploded view of components of the holder according to FIGS. 1 and 2

Figure 5:
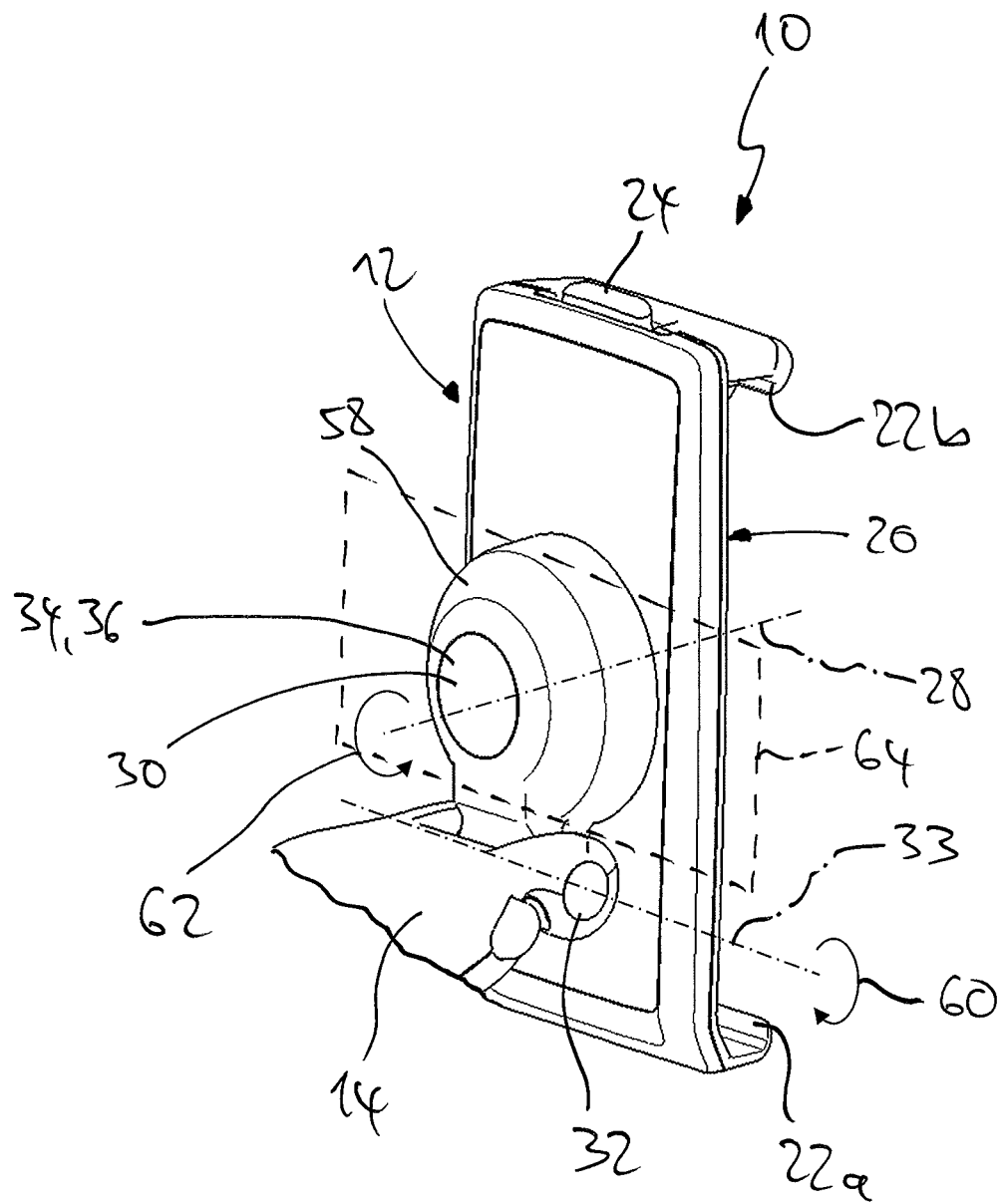
Figure 6:
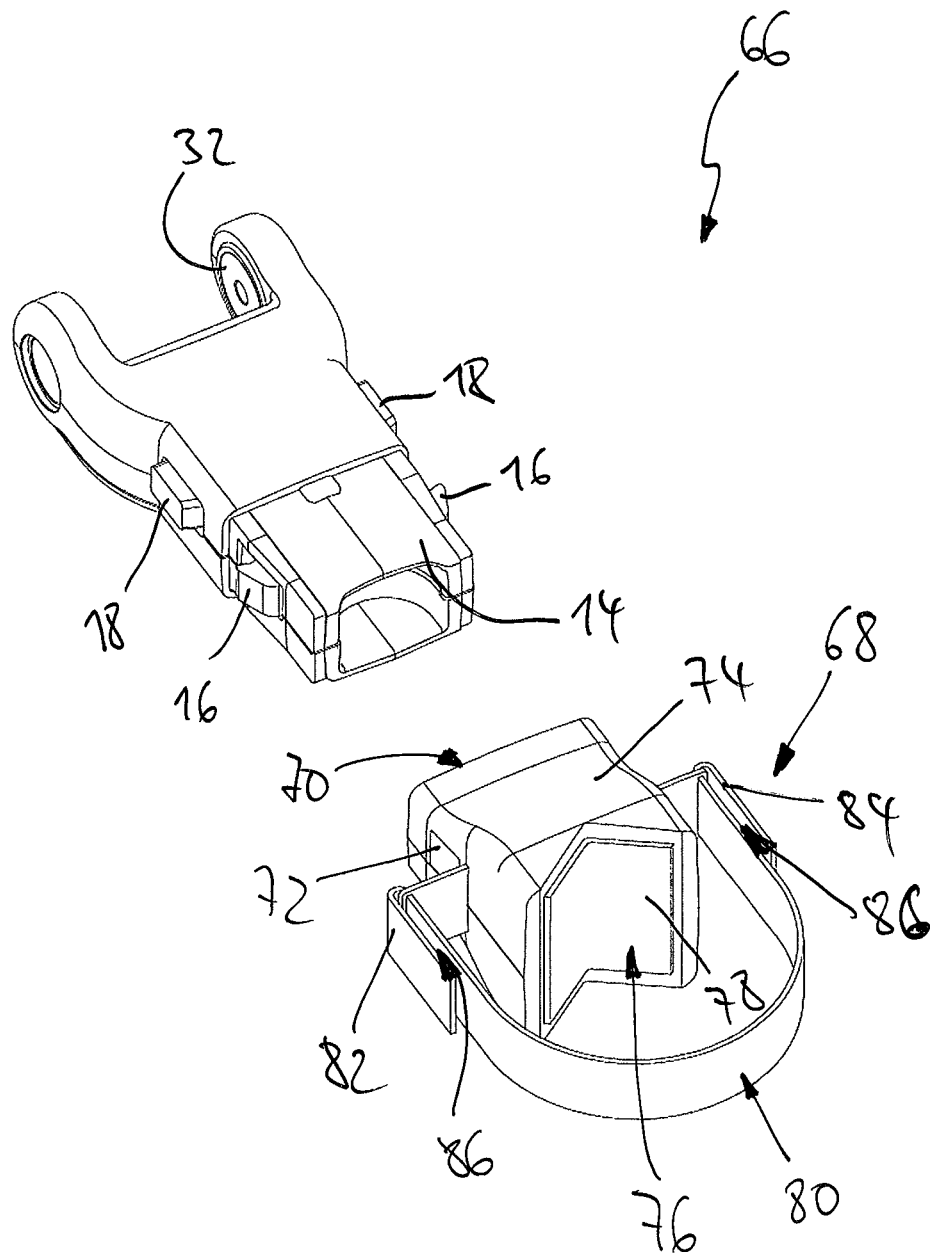
Figure 7:
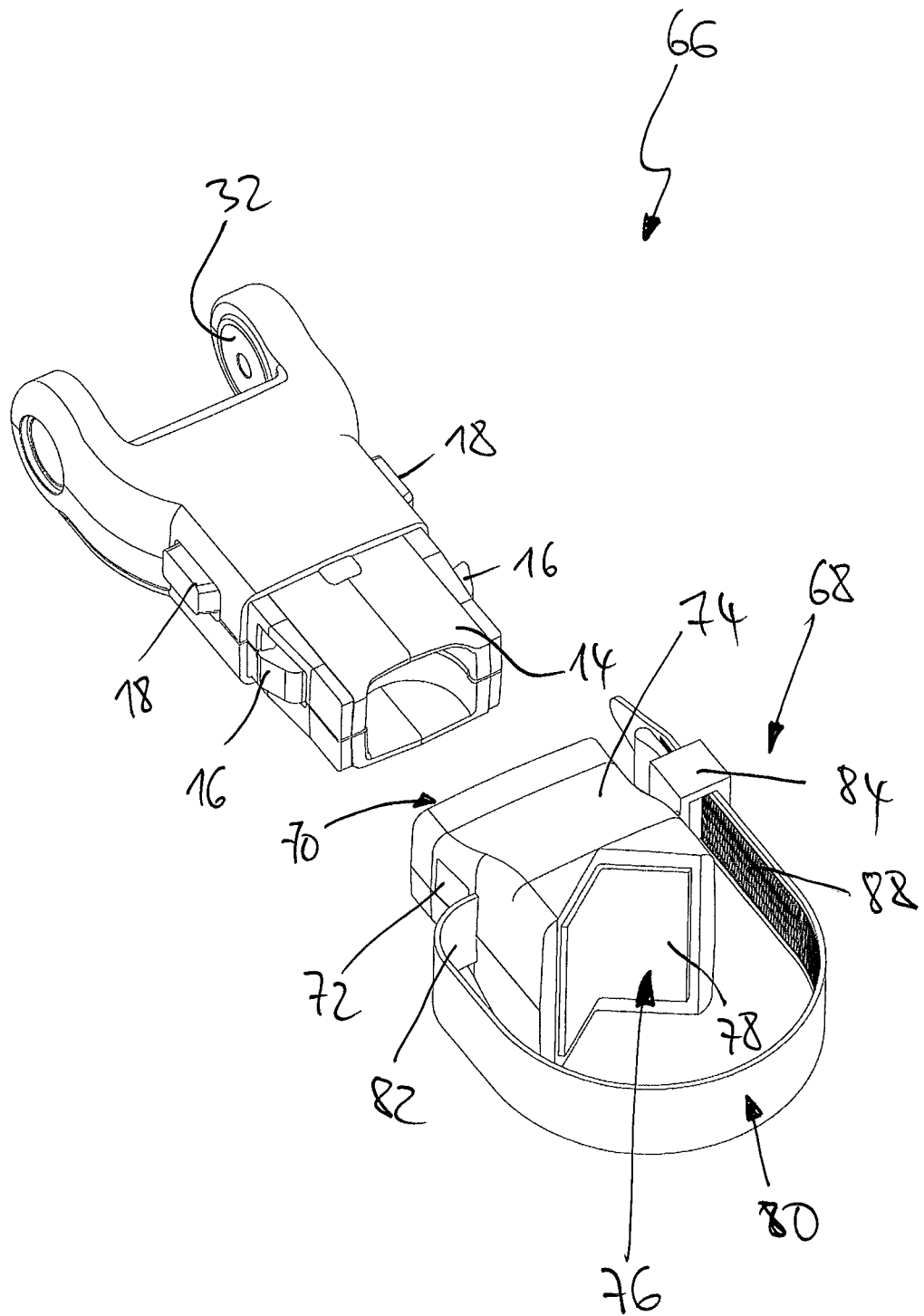
Figure 8:
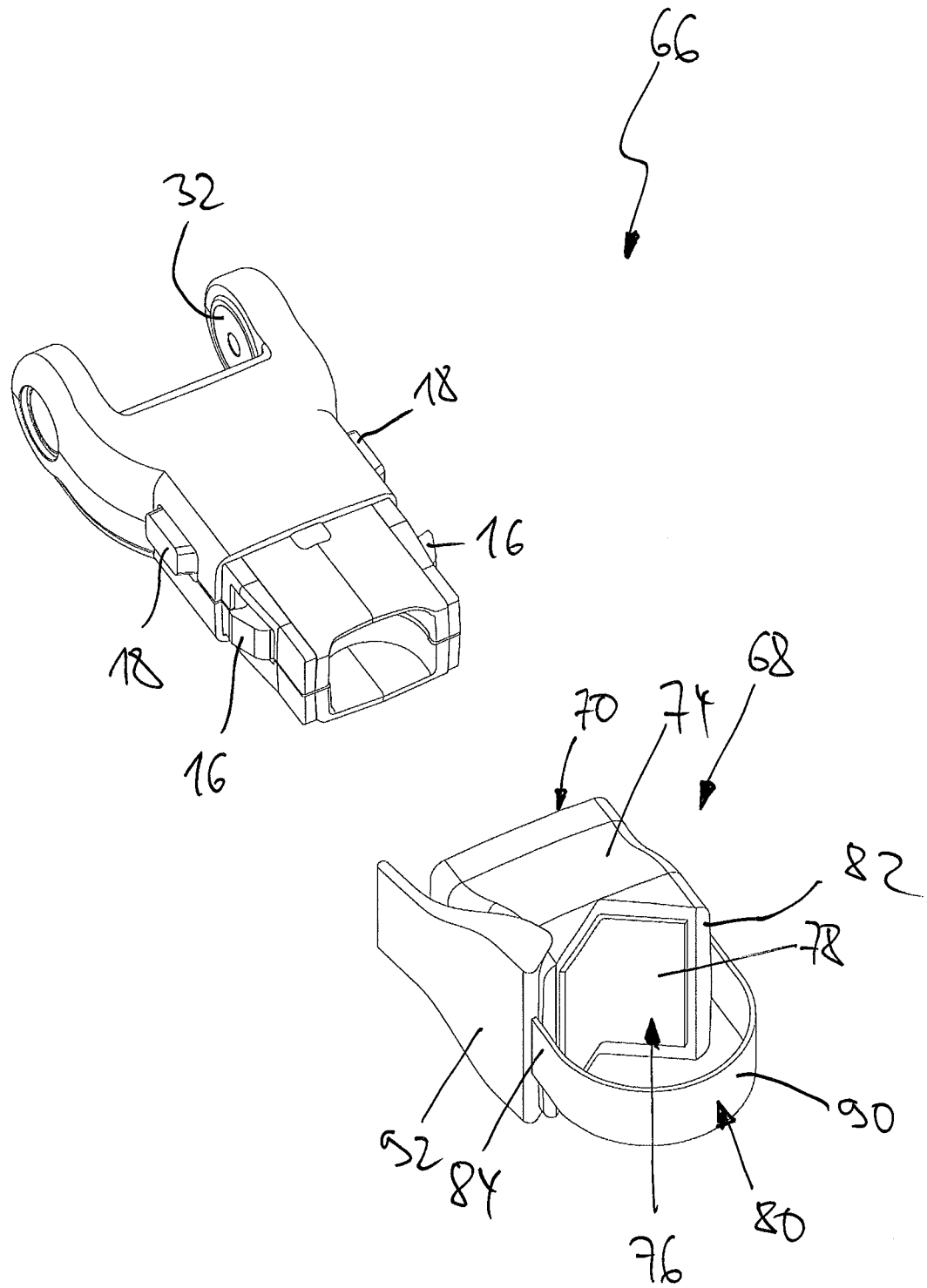
Figure 9:
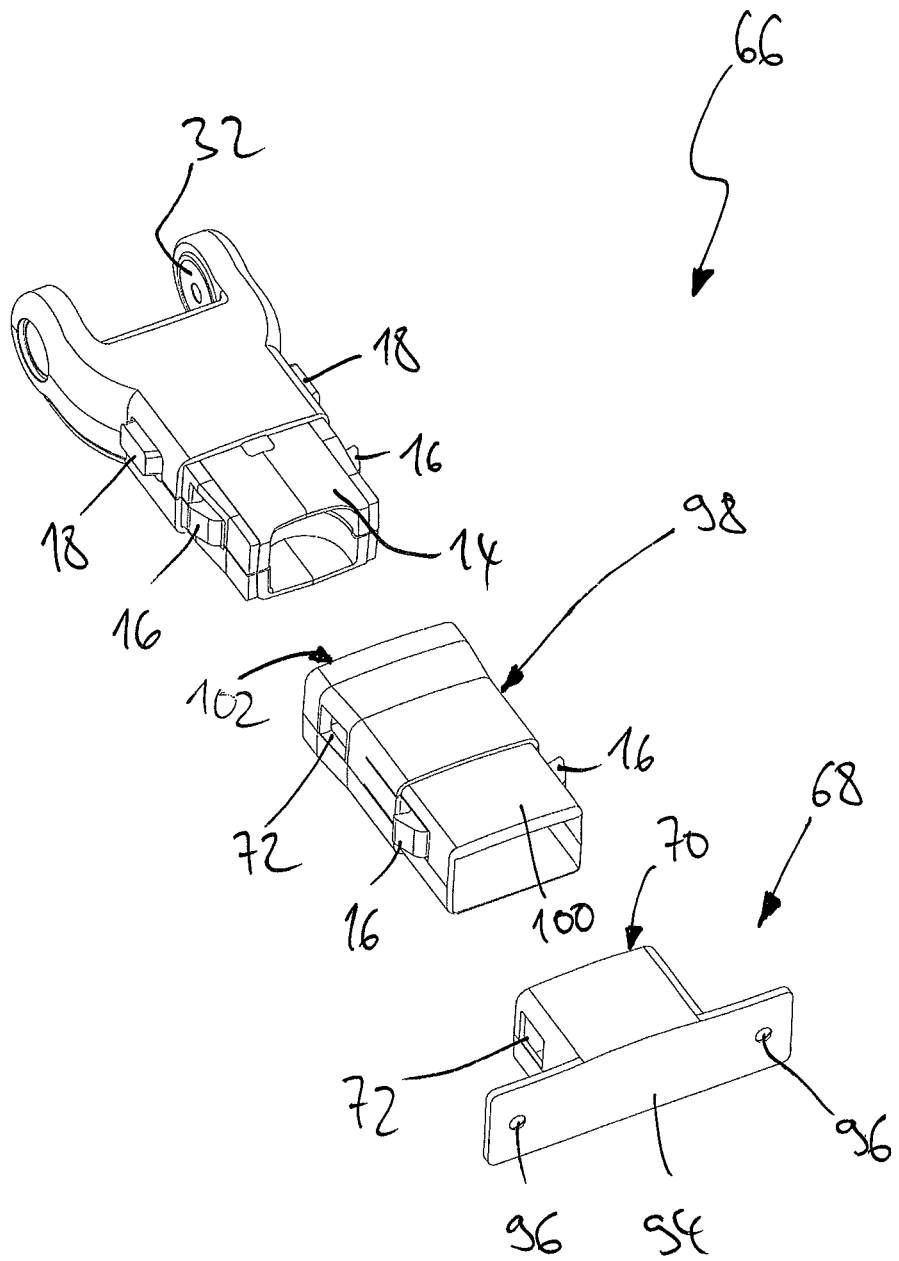
Figure 10:
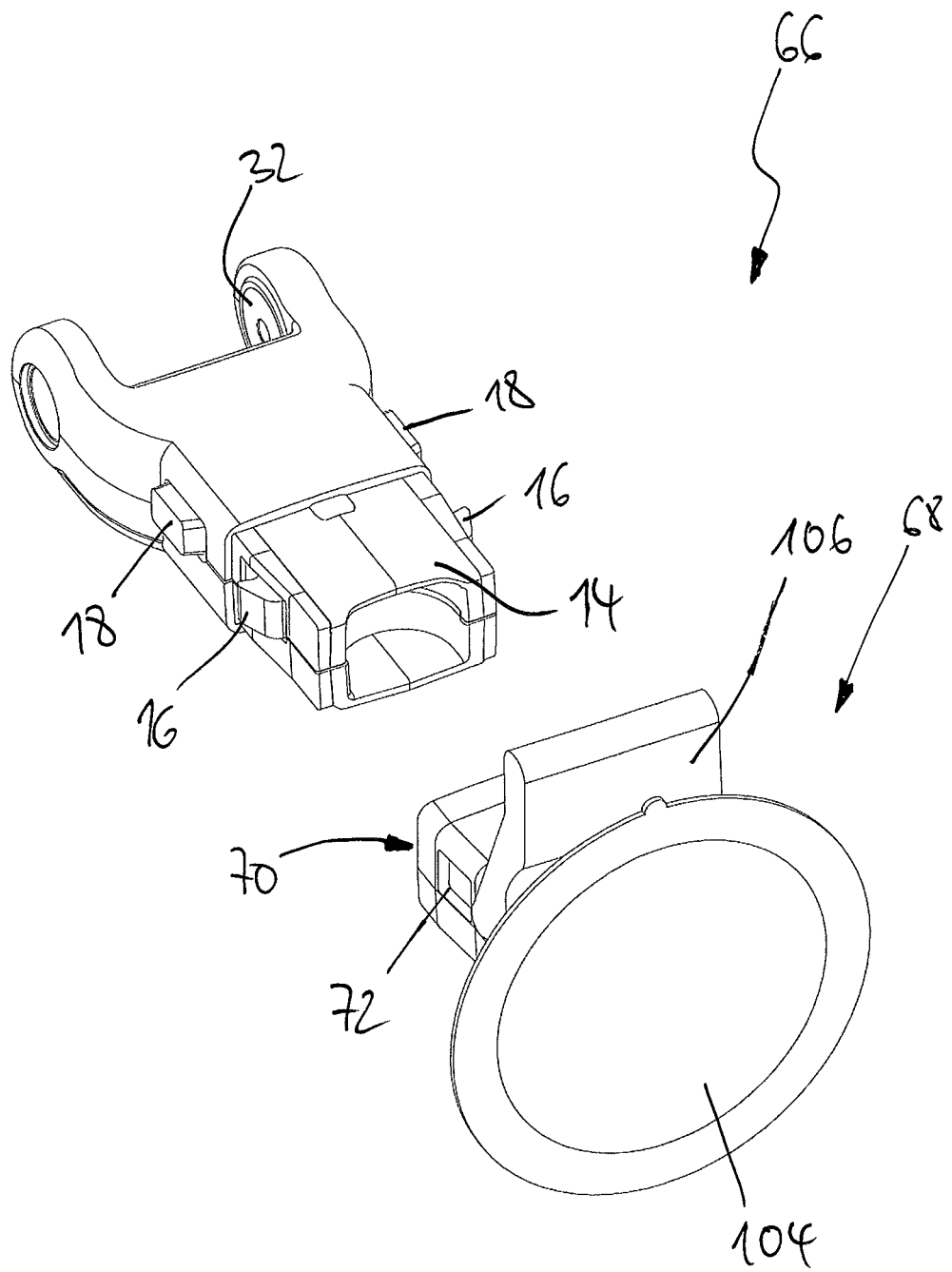

FIG. 5 a perspective rear view of a second design of the holder according to the invention;

FIG. 6 a detail of a first design of the fastening fixture according to the invention;

FIG. 7 a detail of a second design of the fastening fixture according to the invention;

FIG. 8 a detail of a third design of the fastening fixture according to the invention;

FIG. 9 a detail of a fourth design of the fastening fixture according to the invention; and FIG. 10 a detail of a fifth design of the fastening fixture according to the invention.

FIGS. 1 to 4 show a first design of a holder 10 according to the invention for detachably fastening of a flat, approximately rectangular device not shown in the figures such as a tablet computer or a smartphone onto a component, in particular a component of a motor vehicle. FIG. 1 shows the holder 10 in a perspective frontal view, whereas in FIG. 2, the holder 10 is shown in a perspective rear view.

The holder 10 comprises a holding mechanism 12 for detachably holding the device and comprises a fastening element 14 for connecting the holder 10 with the component, e.g. with a corresponding receiving socket in a motor vehicle or with a fastening fixture known from EP 2 437 960 B1 for attaching to two spaced apart headrest rods of a vehicle seat.

For anchoring the fastening element 14 the holder 10 comprises detents 16 that can be unlocked with the push buttons 18. The holding mechanism 12 comprises a receiving portion 20 for the device and clamp-like holder elements 22a, 22b located in the region of the receiving portion 20 for holding the device. As readily apparent from FIGS. 1 and 2, the holding mechanism 12 further comprises in an upper portion a push button 24 that makes it possible to displace the holder elements 22a, 22b relative to each other in the direction of double-arrow 26, and accordingly provide a size adjustment of the holding mechanism 12. However, the holding mechanism 12 is part of a separate patent application and will not be explained in further detail here.

The holder 10 comprises a rotary bearing 30 that is rotatable around an axis of rotation 28 (see FIG. 4), which is connected to the holding mechanism 12. The holder 10 also comprises a pivot bearing 32 connected to the rotary bearing 30 that is connected to the fastening element 14.

The rotary bearing 30 comprises a first rotary bearing portion 34 that is firmly connected to the holding mechanism 12 and which is located on the side of the holding mechanism 12 facing away from the receiving portion 20. The rotary bearing 30 also comprises a second rotary bearing portion 36 that is connected to the fastening element 14. The holder 10 comprises a connecting element 38, wherein the second rotary bearing portion 36 is located on the connecting element 38 and wherein the connecting element 38 comprises pivot bearing portions of the pivot bearing 32. The pivot bearing 32 rotates around a pivot bearing axis of rotation 33, which is arranged perpendicular to the axis of rotation 28 of the rotary bearing 30.

The first rotary bearing portion 34 is shaped as a cone and the second rotary bearing portion 36 is shaped as a counter-cone. The two cones of the rotary bearing portions 34, 36 are coaxially positioned to the axis of rotation 28. Four locking grooves 40 are located at the first rotary bearing portion 34, and are arranged at an angle of 90° to one another around the circumference of the first rotary bearing portion 34. The locking grooves 40 are shaped as V-grooves.

As is particularly apparent from the sectional view of FIG. 3, the two rotary bearing portions 34, 36 are connected via a screw 42 and a nut 44. The screw 42 and the nut 44 are coaxially positioned to the axis of rotation 28 of the rotary bearing 30 and are not shown in the exploded view of FIG. 4 for improving clarity.

In order to provide a locking connection of the rotary bearing 30 or the first rotary bearing portion 34 to the second rotary bearing portion 36, two locking elements are provided on the rotary bearing 30 perpendicular to the axis of rotation 28, the locking elements being displaceable in the direction of the double-arrow 45 between a radial inner locking position and a radial outer release position. The locking elements 46 are arranged in a mirror symmetrical manner with respect to the axis of rotation 28.

In the release position of the locking elements 46 the two rotary bearing portions 34, 36 can be rotated with respect to each other, wherein the rotary bearing portions 34, 36 are fixed against one another when the locking elements 46 are in the locking position.

To lock the two rotary bearing portions 34, 36 the locking elements 46 comprise locking portions 48 which are clearly visible in FIG. 3 and which correspond with the locking grooves 44 in such a way that the locking portions 48 are at least partially engaged into the locking grooves 40 when in locking position.

The locking portions 48 also comprise a V-shaped profile that corresponds with the V-groove profile of the locking grooves 40.

The second rotary bearing portion 36 also comprises two guide portions 50 that are arranged in a mirror symmetrical manner with respect to the axis of rotation 28 and which guide the locking elements 46, wherein these guide portions 50 are designed to guide the locking elements 46. The guide portions 50 thus comprise an inner profile perpendicular to the axis of rotation 28 that corresponds with the outer profile of the locking elements 46 in the direction of the arrow 45. Preferably an inner profile of the guide portions 50 is thus only minimally larger than an outer profile of the locking elements 46.

An annular spring 52 is located radially outside of the locking elements 46, made from spring steel, designed and arranged so that the locking elements 46 are pre-tightened radially inward by the annular spring 52, i.e. in the direction of the arrow 54, into the locking position.

The guide portions 50 are attached in a torque proof manner to the second rotary bearing portion 36 respectively cast into the second rotary bearing portion 36, e.g. via plastics injection molding, wherein the locking elements 46 are guided within the guide portions 50. Because of the guide portions 50 being attached to the rotary bearing portion 36 in a torque proof manner, the locking elements 46 which are guided within the guide portions 50 can engage into the locking grooves 40 for locking with the first rotary bearing portion 34 in such a way that the first rotary bearing portion 34 is fixed in relation to the second rotary bearing portion 36.

Because the locking grooves 40 and the locking portions 48 comprise a V-shaped profile with slanted surfaces, rotation of the first rotary bearing portion 34 in relation to the second rotary bearing portion 36 in the direction of the arrow 56 leads to a relocation of the locking elements 46 into the release position against the spring force of the annular spring 52 by means of sliding of the slanted surfaces of the locking grooves 40 and the slanted surfaces of the locking portions 48 of the locking elements 46 along one another.

The rotary bearing 30 is fully protected against dirt by a cover 58.

By means of the holder 10 according to the invention and because of the direct connection of the rotary bearing 30 to the holding mechanism 12, a particularly stable fastening even for tablet computers with a size greater than 13 inches can be provided on the one hand. On the other hand, because of the locking elements 46, which are set into the locking position by the annular spring 52, and because of the four locking grooves 40, an easy and secure way of locking of the holder 10 in a vertical and horizontal mode is provided.

FIG. 5 shows a second design of the holder 10 according to the invention. Corresponding components and elements are marked with the respective reference numbers. The holder shown in FIG. 5 is able to pivot around the pivot bearing axis of rotation 33 of the pivot bearing 32 in the direction of the arrow 60. Furthermore, as explained above, the holder 10 can rotate by 360° around the axis of rotation 28 of the rotary bearing 30 in the direction of the arrow 62. The pivot bearing axis of rotation 33 is arranged in a plane 64 of the first and/or second rotary bearing portion 34, 36. In this way, a holder 10 can be provided, having a rotary bearing 30 and pivot bearing 32 which can be particularly space saving and compact, allowing for providing a holder 10 having a reduced overall size which can thus be mounted particularly closely to a component, for example to the headrest rods of a motor vehicle.

FIGS. 6 to 10 show a first to fifth design of a detail of the fastening fixture 66 according to the invention, comprising a holder according to the invention and a mounting fixture 68. Corresponding components and elements are marked with the respective reference numbers. The mounting fixture 68 each comprises a receiving socket 70 designed for detachably fastening of the fastening element 14 of the holder 10. When the holder 10 is arranged at the mounting fixture 68, the fastening element 14 is completely engaged into the receiving socket 70 and the detents 16 are locked into locking openings 72 of the respective mounting fixture 68.

The mounting fixtures 68 differ only in the manner of their fastening.

The mounting fixtures 68 of the fastening fixtures 66 shown in FIGS. 6 to 8 comprise a base part 74 with a receiving portion 76, which is designed to be placed on a rod- or tube-shaped component not shown in the figures. An elastically deformable insertion piece 78 that is made from rubber or from soft plastic is arranged within the receiving portion 76.

The mounting fixtures 68 each comprise a band-shaped tensioning device 80 designed to tension fix the mounting fixtures 68 onto the tube-shaped component by tensioning the tube-shaped component between the receiving portion 76 and the tensioning device 80. Because of the elastically deformable insertion piece 78 a tube-shaped component for fixing the mounting fixture 68 onto the tube-shaped component can be particularly easily and reliably clamped between the receiving portion 76 and the band-shaped tensioning device 80.

The band-shaped tensioning device 80 each comprises a first and second end 82, 84 with which it can be fastened onto the base part 74 of the mounting fixtures 68 on a side adjacent to the receiving portion 76.

According to the design of FIG. 6, the band-shaped tensioning device comprises a hook-and-loop fastener 86. According to the design of FIG. 7, the band-shaped tensioning device comprises a cable tie 88. According to the design of FIG. 8, the band-shaped tensioning device comprises an eccentric tensioning device 90 with a knee lever 92.

The fastening fixture 66 shown in FIG. 9 comprises a mounting fixture 68, which is designed to being fastened onto a wall. This mounting fixture comprises a groove stone-shaped fastening portion 94 that comprises drill holes 96, with which the fastening portion 94 or the mounting fixture 68 can be fastened onto a wall. Furthermore, the fastening fixture 66 shown in FIG. 9 comprises an extension part 98, that comprises a fastening element 100 identical to the fastening element 14 and a receiving socket 102, the receiving socket 102 being arranged away from the fastening element 100 with respect to an axial direction and being identical to the receiving socket 70 of the mounting fixtures 68, wherein the receiving socket 102 is preferably arranged axially with respect to the fastening element 100. Furthermore, the extension piece comprises detents 16 and locking openings 72. The fastening element 14 of the holder 10 can thus be inserted into the receiving socket 102 of the extension piece 98, wherein the fastening element 100 of the extension piece 98 can be inserted into the receiving socket 70 of the mounting fixture 68. In this way, an extension of the distance between the pivot bearing 32 and the receiving socket 70 of the mounting fixture 68 can be provided, such that the entire fastening fixture 66 can be better adjusted to the respective mounting requirements.

Concerning the design of the fastening fixture 66 shown in FIG. 10, the mounting fixture 68 comprises a suction cup 104 that is designed to fasten onto an even surface. Furthermore the mounting fixture 68 comprises a release lever 106 designed to detach the suction cup 104.

The invention claimed is:

1. A holder for detachably fastening of a device to a component, the holder comprises:
   a holding mechanism for detachably holding the device and a fastening element that is connected to the holding mechanism to connect the holder with the component, wherein a rotary bearing is provided that is rotatable around an axis of rotation, wherein the rotary bearing is connected to the holding mechanism, and wherein a pivot bearing is provided which is connected to the rotary bearing and which is connected to the fastening element, wherein the rotary bearing comprises
   a first rotary bearing portion connected to the holding mechanism and a second rotary bearing portion connected to the fastening element, wherein locking elements are provided on the rotary bearing perpendicular to the axis of rotation of the rotary bearing, the locking elements being displaceable between a radial inner locking position and a radial outer release position, wherein in the release position the first rotary bearing portion is rotatable in relation to the second rotary bearing portion and wherein in the locking position the first rotary bearing portion is fixed in relation to the second rotary bearing portion, wherein an annular spring is provided which is designed and arranged such that the locking elements are pre-stressed in a radially inward direction into the locking position by the annular spring, wherein
   said locking elements include at least two locking portions,
   said at least two locking portions at least partially engage into locking groves when in the locking position,
   said at least two locking portions include at least a first locking portion and a second locking portion,
   said first locking portion and said second locking portion are both located in a circumferential direction with respect to said axis of rotation of the rotary bearing, and
   said first locking portion and said second locking portion are located at different locations along said circumferential direction.

2. The holder according to claim 1, wherein
   the holding mechanism comprises a receiving portion for the device and holder elements located in the region of the receiving portion for holding the device, and wherein the first rotary bearing portion is located on the side of the holding mechanism facing away from the receiving portion.

3. The holder according to claim 2, wherein
   a connecting element is provided, wherein the second rotary bearing portion is located on the connecting element and wherein the connecting element comprises pivot bearing portions of the pivot bearing.

4. The holder according to claim 3, wherein
   the first rotary bearing portion is designed as cone shaped, and
   the second rotary bearing portion is designed as counter-cone shaped.

5. A holder for detachably fastening of a device to a component, the holder comprises:
   a holding mechanism for detachably holding the device and a fastening element that is connected to the holding mechanism to connect the holder with the component, wherein a rotary bearing is provided that is rotatable around an axis of rotation, wherein the rotary bearing is connected to the holding mechanism, and wherein a pivot bearing is provided which is connected to the rotary bearing and which is connected to the fastening element, wherein the rotary bearing comprises a first rotary bearing portion connected to the holding mechanism and a second rotary bearing portion connected to the fastening element, wherein locking elements are provided on the rotary bearing perpendicular to the axis of rotation of the rotary bearing, the locking elements being displaceable between a radial inner locking position and a radial outer release position, wherein in the release position the first rotary bearing portion is rotatable in relation to the second rotary bearing portion and wherein in the locking position the first rotary bearing portion is fixed in relation to the second rotary bearing portion, wherein an annular spring is provided which is designed and arranged such that the locking elements are pre-stressed in a radially inward direction into the locking position by the annular spring, wherein the holding mechanism comprises a receiving portion for the device and holder elements located in the region of the receiving portion for holding the device, and wherein the first rotary bearing portion is located on the side of the holding mechanism facing away from the receiving portion, a connecting element is provided, wherein the second rotary bearing portion is located on the connecting element and wherein the connecting element comprises pivot bearing portions of the pivot bearing, the first rotary bearing portion is designed as cone shaped, the second rotary bearing portion is designed as counter-cone shaped, and at the first rotary bearing portion, multiple locking grooves are provided which are arranged at regular distances from one another with respect to the circumference of the first rotary bearing portion.

6. The holder according to claim 5, wherein
the locking elements comprise locking portions that correspond with the locking grooves such that the locking portions at least partially engage into the locking grooves when in locking position.

7. The holder according to claim 6, wherein
the locking grooves and the locking portions comprise a profile designed in such a way that rotation of the first rotary bearing portion in relation to the second rotary bearing portion results in a displacement of the locking elements from the locking position to the release position against the spring force of the annular spring.

8. The holder according to claim 7, wherein
multiple locking elements are provided in a mirror symmetrical manner with respect to the axis of rotation.

9. The holder according to claim 8, wherein
multiple guide portions are provided on the second rotary bearing for the locking elements which are arranged in a mirror symmetrical manner with respect to the axis of rotation.

10. The holder according to claim 9, wherein
the guide portions are designed to guide the locking elements.

11. The holder according to claim 10, wherein
the pivot bearing comprises a pivot bearing axis of rotation, wherein the pivot bearing axis of rotation is located in a plane of the first and/or second rotary bearing portion.

12. A fastening fixture including a holder according to claim 1 and at least one mounting fixture that comprises a receiving socket, which is designed for detachably fastening of the fastening element of the holder.

13. The Fastening fixture according to claim 12, wherein
the mounting fixture comprises a base part with a receiving portion designed for being arranged at a tube-shaped component, and wherein the mounting fixture comprises a band-shaped tensioning device designed for tensioning of the mounting fixture at the tube-shaped component by tensioning the tube-shaped component between the receiving portion and the tensioning device.

14. The Fastening fixture according to claim 13, wherein
the band-shaped tensioning device includes a hook-and-loop fastener and/or a cable tie and/or an eccentric tensioning device.

15. The Fastening fixture according to claim 12, wherein
the mounting fixture comprises a suction cup designed for being fastened onto an even surface.

16. The Fastening fixture according to claim 12, wherein
the mounting fixture is designed for being fastened onto a wall.

17. The Fastening fixture according to claim 15, wherein
an extension piece is provided that comprises a fastening element and a receiving socket, the receiving socket being arranged away from the fastening element with respect to an axial direction, wherein the receiving socket is arranged axially with respect to the fastening element.

18. The holder according to claim 1, wherein
said device is a flat device, and
said component is a component of a motor vehicle.

19. The holder according to claim 18, wherein
said flat device is a tablet computer or a smartphone.

20. The holder according to claim 5, wherein
at the first rotary bearing portion, 4 locking grooves are provided.

21. The holder according to claim 8, wherein
2 locking elements are provided.

22. The holder according to claim 9, wherein
2 guide portions are provided.

* * * * *